(12) United States Patent
Matsunaga

(10) Patent No.: US 12,336,232 B2
(45) Date of Patent: Jun. 17, 2025

(54) SEMICONDUCTOR DEVICE

(71) Applicant: FUJI ELECTRIC CO., LTD., Kawasaki (JP)

(72) Inventor: Shinichiro Matsunaga, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 581 days.

(21) Appl. No.: 17/829,106

(22) Filed: May 31, 2022

(65) Prior Publication Data

US 2022/0416018 A1 Dec. 29, 2022

(30) Foreign Application Priority Data

Jun. 23, 2021 (JP) ................... 2021-104096

(51) Int. Cl.
*H10D 12/00* (2025.01)
*H10D 30/66* (2025.01)
(Continued)

(52) U.S. Cl.
CPC ......... *H10D 62/102* (2025.01); *H10D 12/481* (2025.01); *H10D 30/665* (2025.01); *H10D 30/668* (2025.01)

(58) Field of Classification Search
CPC .. H10D 12/481; H10D 30/665; H10D 30/668; H10D 62/102; H10D 62/107; H10D 62/141; H10D 62/157; H10D 62/393
See application file for complete search history.

(56) References Cited

U.S. PATENT DOCUMENTS

| 6,037,632 A | 3/2000 | Omura et al. |
| 2006/0097267 A1* | 5/2006 | Kumar ................ H10D 30/635 257/77 |

(Continued)

FOREIGN PATENT DOCUMENTS

| JP | 109191109 A | 7/1997 |
| JP | 2005142243 A | 6/2005 |

(Continued)

OTHER PUBLICATIONS

Japanese Office Action dated Mar. 4, 2025, in the counterpart Japanese Patent Application No. 2021-104096.

*Primary Examiner* — Omar F Mojaddedi
(74) *Attorney, Agent, or Firm* — Rabin & Berdo, P.C.

(57) ABSTRACT

A semiconductor device includes a first semiconductor layer of a first conductivity type; a second semiconductor layer of the first conductivity type; a first semiconductor region of a second conductivity type; a second semiconductor region of the first conductivity type; a trench; a gate insulating film; a gate electrode; a third semiconductor region of the second conductivity type; a fourth semiconductor region of the second conductivity type; a fifth semiconductor region of the first conductivity type, selectively provided in the second semiconductor layer and having an impurity concentration lower than an impurity concentration of the second semiconductor layer; a first electrode; and a second electrode. The fifth semiconductor region has one surface in contact with the first semiconductor region, another surface in contact with the third semiconductor region, and a side surface in contact with the gate insulating film.

5 Claims, 7 Drawing Sheets

(51) Int. Cl.
*H10D 62/00* (2025.01)
*H10D 62/10* (2025.01)

(56) References Cited

U.S. PATENT DOCUMENTS

| | | | | |
|---|---|---|---|---|
| 2006/0289928 | A1* | 12/2006 | Takaya | H10D 62/111 |
| | | | | 257/493 |
| 2010/0224932 | A1* | 9/2010 | Takaya | H10D 62/157 |
| | | | | 257/E21.334 |
| 2015/0372090 | A1* | 12/2015 | Oosawa | H10D 64/519 |
| | | | | 438/270 |
| 2017/0221714 | A1* | 8/2017 | Wakimoto | H10D 30/668 |
| 2018/0175147 | A1* | 6/2018 | Ohse | H10D 62/299 |
| 2019/0140093 | A1* | 5/2019 | Okumura | H10D 62/157 |
| 2020/0020797 | A1* | 1/2020 | Suzuki | H10D 62/107 |
| 2020/0035791 | A1 | 1/2020 | Oshima et al. | |

FOREIGN PATENT DOCUMENTS

| | | | |
|---|---|---|---|
| JP | 2007242852 | A | 9/2007 |
| JP | 2016115847 | A | 6/2016 |
| JP | 2018101706 | A | 6/2018 |
| JP | 2020017641 | A | 1/2020 |

\* cited by examiner

SEMICONDUCTOR DEVICE

CROSS REFERENCE TO RELATED APPLICATIONS

This application is based upon and claims the benefit of priority of the prior Japanese Patent Application No. 2021-104096, filed on Jun. 23, 2021, the entire contents of which are incorporated herein by reference.

BACKGROUND OF THE INVENTION

1. Field of the Invention

Embodiments of the invention relate to a semiconductor device.

2. Description of the Related Art

A device having a trench gate structure in which Metal Oxide Semiconductor (MOS) gates are embedded in trenches formed in a semiconductor substrate is one commonly known conventional semiconductor device used in power devices and having a MOS gate (insulated gate configured by a metal, an oxide film, and a semiconductor) structure (hereinafter, MOS-type semiconductor device). In a MOS-type semiconductor device having a trench gate structure, generally, there is a tradeoff between high breakdown voltage and low on-resistance. A device that includes a floating region of a conductivity type different from that of a drift layer, provided so as to surround a bottom (end that faces drain) of a trench in which a MOS gate is embedded has been proposed as a MOS-type semiconductor device that improves such a tradeoff (for example, refer to Japanese Laid-Open Patent Publication No. 2005-142243).

A structure of a conventional MOS-type semiconductor device is described. FIG. 9 is a cross-sectional view of the structure of components of a conventional semiconductor device. FIG. 9 depicts the structure of a unit cell (functional unit of a device element) disposed in an active region through which current flows during an on-state. FIG. 9 corresponds to FIG. 1 of Japanese Laid-Open Patent Publication No. 2005-142243. As depicted in FIG. 9, a conventional semiconductor device 100 includes a MOS gate structure at a first main surface side of an $n^-$-type drift layer 102, and an $n^+$-type drain layer 101 at a second main surface side of the $n^-$-type drift layer 102. The MOS gate structure is configured by $p^-$-type base regions 103, $n^+$-type source regions 104, trenches 105, a deposited insulating layer 106, a gate insulating film 107, and gate electrodes 108. The $n^+$-type source regions 104 are selectively provided in the $p^-$-type base regions 103.

The trenches 105 penetrate through the $n^+$-type source regions 104 and the $p^-$-type base regions 103 in a depth direction and reach the $n^-$-type drift layer 102. Each of the trenches 105 has an end facing the drain, and the deposited insulating layer 106 is embedded in each of the trenches 105, at the end facing the drain. The gate electrodes 108 are provided on (side facing the source) the deposited insulating layer 106 in the trenches 105. The gate electrodes 108 face the $p^-$-type base regions 103 and the $n^+$-type source regions 104 with the gate insulating film 107, which is provided at sidewalls of the trenches 105, intervening therebetween. In the $n^-$-type drift layer 102, p-type diffused regions (hereinafter, p-type embedded regions) 109 in a floating state are provided. The bottoms of the trenches 105 are positioned in the p-type embedded regions 109. Reference numerals 110 and 111 are a source electrode and a drain electrode, respectively.

The conventional semiconductor device 100 has a structure (hereinafter, floating structure) that includes in the $n^-$-type drift layer 102, the p-type embedded regions 109 in a floating state and thereby, further has the following characteristics. In an off-state in which gate voltage is not applied (or negative gate voltage is applied), in the $n^-$-type drift layer 102, a depletion layer (not depicted) spreads from pn junctions 121 between the $p^-$-type base regions 103 and the $n^-$-type drift layer 102. The depletion layer reaches the p-type embedded regions 109, whereby the p-type embedded regions 109 are in a punch-through state and potential from the pn junctions 121 between the $p^-$-type base regions 103 and the $n^-$-type drift layer 102, to the p-type embedded regions 109 is fixed. Further, in the $n^-$-type drift layer 102, a depletion layer (not depicted) also spreads from pn junctions 122 between the p-type embedded regions 109 and the $n^-$-type drift layer 102.

In this manner, a depletion layer spreads from the pn junctions 121 between the $p^-$-type base regions 103 and the $n^-$-type drift layer 102, whereby electric field strength peaks near the pn junctions 121. A depletion layer further spreads from the pn junctions 122 between the p-type embedded regions 109 and the $n^-$-type drift layer 102, whereby the electric field strength also peaks near the pn junctions 122. In other words, peaks of the electric field strength may be distributed among these two locations. Thus, the maximum peak value of the electric field strength may be reduced, facilitating high breakdown voltage. Further, high breakdown voltage may be ensured and therefore, an impurity concentration of the $n^-$-type drift layer 102 may be increased, thereby facilitating reduced on-resistance. Regarding a mechanism of such a floating structure, results of calculation of electric field strength distribution have been disclosed in detail (for example, refer to Japanese Laid-Open Patent Publication No. H09-191109).

For example, in a general MOS-type semiconductor device used in an inverter circuit, etc., in general, turning the semiconductor device on/off is controlled by a gate voltage Vg and therefore, drain voltage Vd varies. FIG. 10 is a characteristics diagram depicting voltage waveforms of the conventional semiconductor device. In particular, as depicted in FIG. 10, in an on-state (hereinafter, first state A) in which the applied gate voltage Vg is at least equal to a threshold voltage, no depletion layer spreads in the $n^-$-type drift layer and therefore, operation is in a state in which the drain voltage Vd is low and the on-resistance is low. On the other hand, during maintenance of the off-state without application of the gate voltage Vg (hereinafter, second state B), a state in which the depletion layer has spread in the $n^-$-type drift layer (high on-resistance state) is entered, and a state in which the drain voltage Vd is high is maintained. In other words, due to the spreading of the depletion layer, breakdown voltage between the drain and source is maintained. Further, transition from the off-state to the on-state occurs again (hereinafter, third state C), whereby the width of the depletion layer that spread during the second state B decreases and thus, again, operation is under a state of low on-resistance. Thereafter, the second state B and the third state C repeatedly alternate each another. In this manner, in a normal MOS-type semiconductor device (MOS-type semiconductor device without the floating structure), during the second state B, a depletion layer spreads from pn junctions between $p^-$-type base regions in the $n^-$-type drift layer and the $n^-$-type drift layer. Furthermore, the width of the depletion layer that spread from the pn junctions between the p⁻-type base regions and the n⁻-type drift layer during the second state B immediately narrows due to holes being supplied from the p⁻-type base regions to the n⁻-type drift layer during the third state C.

However, in the conventional semiconductor device 100 with the floating structure depicted in FIG. 9, compared to the normal MOS-type semiconductor device, in the third state C, returning to the low on-resistance state from the high on-resistance state is difficult. A reason for this is as follows. In the conventional semiconductor device 100, during the second state B, depletion layers spread from two locations, the pn junctions 121 between the p⁻-type base regions 103 and the n⁻-type drift layer 102, and the pn junctions 122 between the p-type embedded regions 109 and the n⁻-type drift layer 102. Further, during the third state C, while holes from an external source are supplied to the p⁻-type base regions 103 that are connected to the source electrodes 110, the p-type embedded regions 109 are in a floating state and thus, the holes from the external source are not supplied to the p-type embedded regions 109. Therefore, during the third state C, the supply of holes from the p-type embedded regions 109 themselves alone cannot supplement a sufficient amount of holes in a short period to reduce the widths of the depletion layers that spread at the drain side of the p-type embedded regions 109. In other words, the amount of holes to be supplied to reduce the width of the depletion layer is insufficient during the third state C, and it takes time for the widths of the depletion layers that spread at the drain side of the p-type embedded regions 109 to again be narrowed. As a result, as depicted by a dotted line in FIG. 10, the drain voltage Vd during the third state C gradually decreases until reaching a minimum value. Therefore, the low on-resistance state is not immediately returned to, which adversely affects transient on-resistance properties. In particular, the amount of holes to be supplied to reduce the widths of the depletion layers during the third state C increases in an instance of large chip size and therefore, the greater is the chip size, the greater is the delay in the supply of the holes. In general, the chip size that adversely affects on-resistance characteristics is about a few mm square or more.

Further, as another conventional device with a floating structure, a device has been proposed that includes p⁻⁻⁻-type diffused regions that constitute a hole supply path to p-type regions in a floating state during the on-state, the p⁻⁻⁻-type diffused regions being provided along a gate insulating film that is provided at the sidewalls of a trench, and the p⁻⁻⁻-type diffused regions being provided so as to connect p⁻-type base regions and the p-type diffused regions (p-type embedded regions) of the floating state (for example, refer to Japanese Laid-Open Patent Publication No. 2007-242852).

A structure depicted in Japanese Laid-Open Patent Publication No. 2007-242852 is described. FIG. 11 is a cross-sectional view depicting another example of a conventional semiconductor device. FIG. 11 depicts a cross section of the structure, the gate electrode 108 being embedded in the trench 105 and cut along a longitudinal direction of the trench 105 that has a linear shape in a plan view. FIG. 11 corresponds to FIG. 4 in Japanese Laid-Open Patent Publication No. 2007-242852. A conventional semiconductor device 200 depicted in FIG. 11 differs from the conventional semiconductor device 100 depicted in FIG. 9 in that the p⁻-type diffused regions 112 are provided in the n⁻-type drift layer 102. The p⁻-type diffused regions 112 are provided in the deposited insulating layer 106, along portions thereof at the sidewalls of the trench 105; the p⁻⁻⁻-type diffused regions 112 connect the p⁻-type base regions 103 and the p-type embedded region 109.

The p⁻⁻⁻-type diffused regions 112 have an extremely low impurity concentration and due to a depletion layer that spreads from pn junctions between the p⁻-type diffused regions 112 and the n⁻-type drift layer 102, becomes a region with extremely high resistance. Therefore, during the off-state, the p-type embedded region 109 is in a floating state similarly to the conventional semiconductor device 100 (Japanese Laid-Open Patent Publication No. 2005-142243, Japanese Laid-Open Patent Publication No. H09-191109) depicted in FIG. 9. Thus, similarly to the floating structure described above, a state is entered in which the breakdown voltage between the drain and source is maintained, and high breakdown voltage may be facilitated. On the other hand, during the on-state, the p-type embedded region 109 is fixed to the source potential by the p⁻-type diffused regions 112, whereby holes are supplied from the p-type embedded region 109 to the n⁻-type drift layer 102. Therefore, the amount of holes supplied during the on-state may be increased.

In FIG. 11, reference numerals 115, 116, 117, 118, and 119 are trenches, a deposited insulating layer, a gate insulating film, gate electrodes, and p-type embedded regions, respectively, of a termination structure area 202. The trenches 115, the deposited insulating layer 116, the gate insulating film 117, the gate electrodes 118, and the p-type embedded regions 119 of the termination structure area 202 have the same structure as the trench 105, the deposited insulating layer 106, the gate insulating film 107, the gate electrode 108, and the p-type embedded region 109, respectively, of an active region 201. The gate electrodes 118 are provided in the trenches 115 that are closest to the active region 201 while in the other trenches 115, the deposited insulating layer 116 is embedded. The termination structure area 202 surrounds a periphery of the active region 201 and is a region that mitigates electric field of the first main surface side of the n⁻-type drift layer 102 and maintains the breakdown voltage.

SUMMARY OF THE INVENTION

According to an embodiment of the invention, a semiconductor device includes a first semiconductor layer of a first conductivity type, having a first main surface and a second main surface that are opposite to each other; a second semiconductor layer of the first conductivity type, provided at the first main surface of the first semiconductor layer, the second semiconductor layer having an impurity concentration that is higher than an impurity concentration of the first semiconductor layer, the second semiconductor layer having a first surface and a second surface that are opposite to each other, the second surface thereof facing the first semiconductor layer; a first semiconductor region of a second conductivity type, provided at the first surface of the second semiconductor layer; a second semiconductor region of the first conductivity type, selectively provided in the first semiconductor region; a trench that penetrates through the second semiconductor region and the first semiconductor region and reaches the first semiconductor layer; a gate insulating film provided in the trench, along a bottom and sidewalls of the trench; a gate electrode provided on the gate insulating film in the trench; a third semiconductor region of the second conductivity type, selectively provided in the first semiconductor layer to surround the bottom of the trench; a fourth semiconductor region provided at the second main surface of the first semiconductor layer; a fifth semiconductor region of the first conductivity type, selectively provided in the second semiconductor layer, the fifth semiconductor region having an impurity concentration that is lower than the impurity concentration of the second semiconductor layer; a first electrode that is electrically connected to the first semiconductor region and the second semiconductor region; and a second electrode that is electrically connected to the fourth semiconductor region. The fifth semiconductor region has a first surface and a second surface that are opposite to each other, the first surface being in contact with the first semiconductor region, the second surface being in contact with the third semiconductor region, and a side surface that is in contact with the gate insulating film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
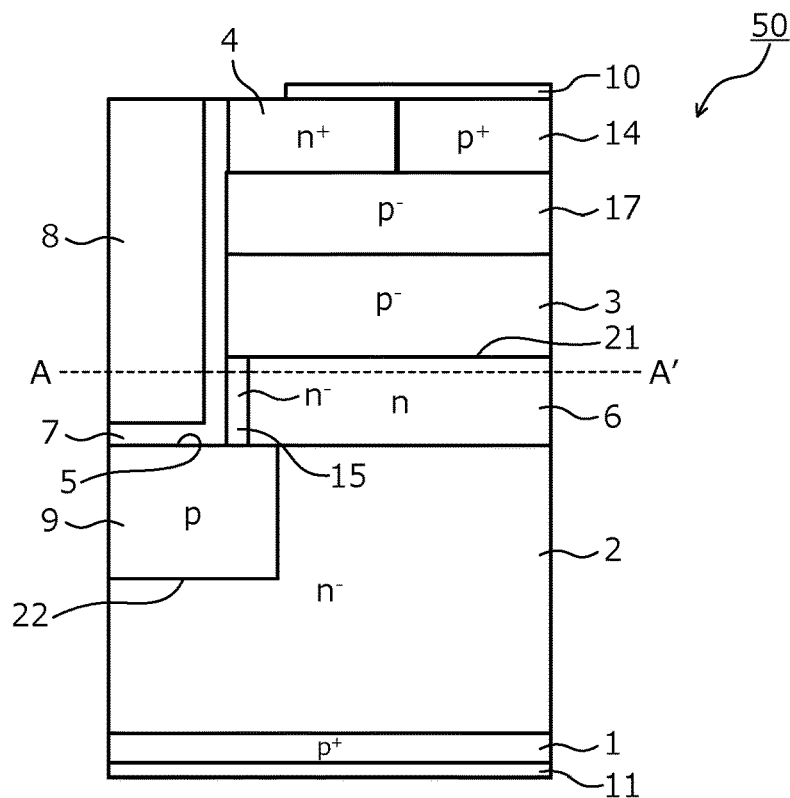
FIG. 1 is a cross-sectional view depicting a structure of a semiconductor device according to a first embodiment.

First, problems associated with the conventional techniques are discussed. In Japanese Laid-Open Patent Publication No. 2005-142243 and Japanese Laid-Open Patent Publication No. H09-191109, while the electric field strength near the bottoms of the trenches 105 may be reduced, there is no mention of preventing the pulling out of minority carriers (holes) during the on-state. Further, even when Japanese Laid-Open Patent Publication No. 2005-142243 or Japanese Laid-Open Patent Publication No. H09-191109 is applied to a device that uses a conductivity modulation effect such as that of an insulated gate bipolar transistor (IGBT), the conductivity modulation effect is not enhanced.

Further, the p$^-$-type diffused regions 112 are formed at the sidewalls of the trench 105 by performing oblique ion implantation or multiple sessions of epitaxial growth. Therefore, the process is complicated and thus, problematic. Further, in Japanese Laid-Open Patent Publication No. 2007-242852, in an instance of application to a device that uses a conductivity modulation effect such as that of an IGBT, during the on-state, holes are pulled out from the p-type embedded region 109 that is fixed at the source potential. Therefore, conductivity modulation is less likely to occur and a problem arises in that the on-resistance characteristics degrade.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or −appended to n or p means that the impurity concentration is higher or lower, respectively, than layers and regions without+ or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention is configured using a wide band gap semiconductor. In a first embodiment, for example, a silicon carbide semiconductor device fabricated (manufactured) using silicon carbide (SiC) as a wide band gap semiconductor is described taking a trench-type IGBT 50 as an example.

FIG. 1 is a cross-sectional view depicting a structure of the semiconductor device according to the first embodiment. As depicted in FIG. 1, in the semiconductor device according to the first embodiment, a MOS gate structure of a trench gate structure is provided at a first main surface of an n$^-$-type drift layer (first semiconductor layer of a first conductivity type) 2. The MOS gate structure is configured by a p$^-$-type base region (first semiconductor region of a second conductivity type) 3, an n$^+$-type emitter region (second semiconductor region of the first conductivity type) 4, a trench 5, a gate insulating film 7, and a gate electrode 8. The trench 5, for example, as depicted in FIG. 1, has a shape of a stripe. In FIG. 1, only an active region through which a main current of the trench-type IGBT 50 passes is depicted.

At a second main surface side of the n$^-$-type drift layer 2, a p$^+$-type collector layer (fourth semiconductor region of the second conductivity type) 1 is provided. The p$^+$-type collector layer 1 may be a diffused region formed by ion implantation in the n$^-$-type drift layer 2 at a second main surface of the n$^-$-type drift layer 2, for example, or may be configured by a p$^+$-type starting substrate (semiconductor chip) prepared for fabricating (manufacturing) the semiconductor device according to the first embodiment. In an instance in which the p$^+$-type collector layer 1 is a p$^+$-type starting substrate, the n$^-$-type drift layer 2 is an epitaxial layer that is deposited on a front surface of the p$^+$-type starting substrate that constitutes the p$^+$-type collector layer 1, for example.

At a first main surface of the n$^-$-type drift layer 2, a high-concentration n-type layer (second semiconductor layer of the first conductivity type) 6 is provided. The high-concentration n-type layer 6 is a so-called current spreading layer (CSL) that reduces carrier spreading resistance. The high-concentration n-type layer 6 is provided between the p⁻-type base region 3 and a later-described p-type embedded region 9, the high-concentration n-type layer 6 having an impurity concentration that is higher than an impurity concentration of the n⁻-type drift layer 2. For example, in an instance in which the impurity concentration of the n⁻-type drift layer 2 is in a range of about $1\times10^{14}/cm^3$ to $1\times10^{16}/cm^3$, the impurity concentration of the high-concentration n-type layer 6 is, for example, at most about $1\times10^{17}/cm^3$.

The high-concentration n-type layer 6 has a portion in contact with the later-described gate insulating film 7 and in the portion, an n⁻-type region (fifth semiconductor region of the first conductivity type) 15 is provided. The n⁻-type region 15 has an impurity concentration that is about the same as the impurity concentration of the n⁻-type drift layer 2. The n⁻-type region 15 has a thickness that is about the same as a thickness of the high-concentration n-type layer 6. Therefore, a first surface thereof is in contact with the p⁻-type base region 3 while a second surface is in contact with the p-type embedded region 9.

Figure 2:
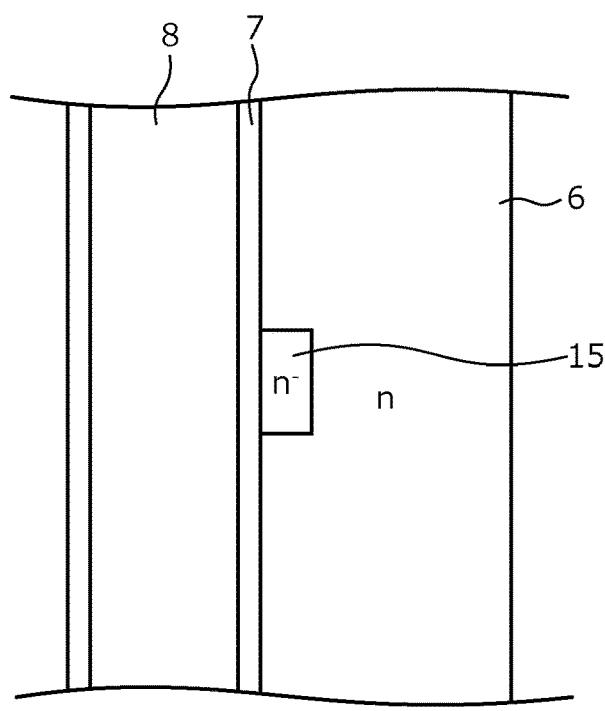
FIG. 2 is a top view along cutting line A-A' in FIG. 1 depicting the structure of the semiconductor device according to the first embodiment.
Figure 3:
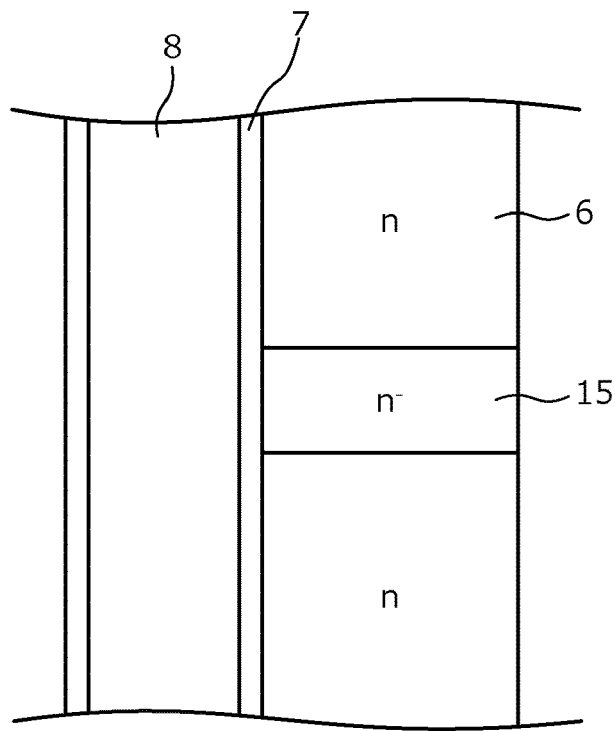
FIG. 3 is a top view along cutting line A-A' in FIG. 1 depicting the structure of the semiconductor device according to the first embodiment.
Figure 4:
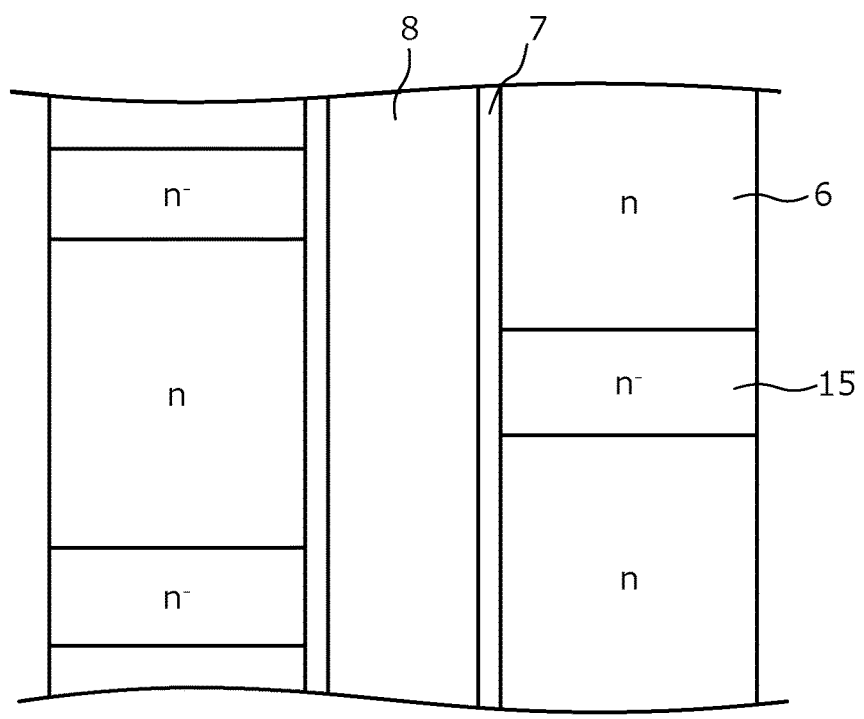
FIG. 4 is a top view along cutting line A-A' in FIG. 1 depicting the structure of the semiconductor device according to the first embodiment.

FIGS. 2, 3, and 4 are top views along cutting line A-A' in FIG. 1 depicting the structure of the semiconductor device according to the first embodiment. As depicted in FIG. 2, a width of the n⁻-type region 15 may be narrower than a width of the high-concentration n-type layer 6 or as depicted in FIG. 3, the width of the n⁻-type region 15 may be equal to the width of the high-concentration n-type layer 6. The n⁻-type region 15 has an impurity concentration that is lower than the impurity concentration of the high-concentration n-type layer 6 and with a high resistance, as described hereinafter, an inversion layer of the n⁻-type region 15 is formed in a portion in contact with the gate insulating film 7 and therefore, preferably, the width of the n⁻-type region 15 may be narrower than the width of the high-concentration n-type layer 6. FIGS. 2 and 3 show only one side of the gate insulating film 7, and the n⁻-type region 15 is further provided symmetrically at an identical position on the opposite side of the gate insulating film 7. Further, as depicted in FIG. 4, the n⁻-type region 15 may be provided asymmetrically. Further, the n⁻-type region 15 may be provided only on one side. Further, preferably, the n⁻-type region 15 may be provided in plural along a longitudinal direction of the trench 5 (direction of view of FIG. 1). A reason for this is that when the n⁻-type region 15 is provided singularly, a distance of a portion with the n⁻-type region 15 and a portion apart from the n⁻-type region 15 increases, thereby increasing the potential difference.

Figure 5:
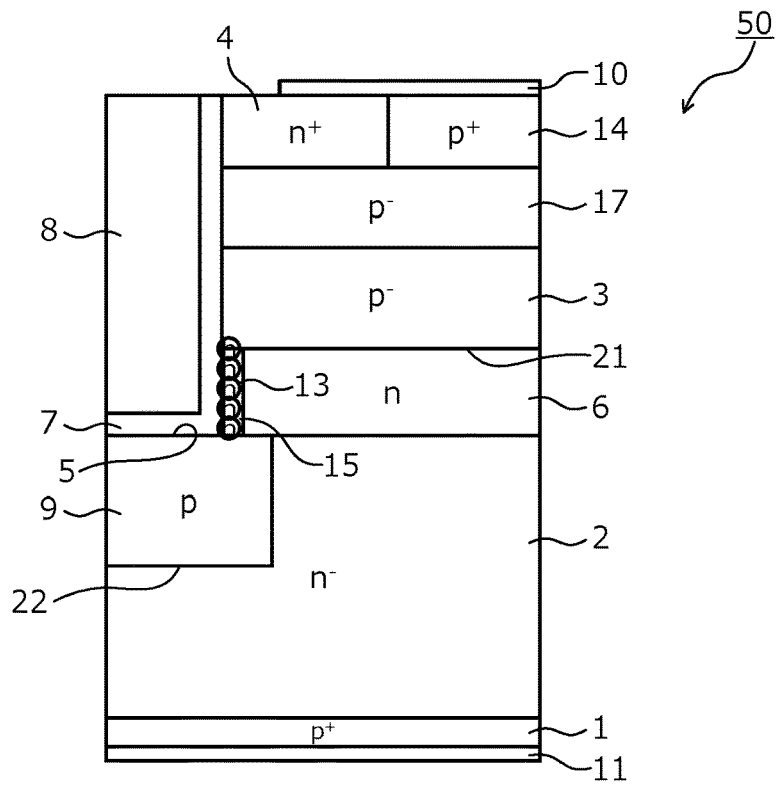
FIG. 5 is a cross-sectional view depicting operation of the semiconductor device according to the first embodiment, during an off-state.
Figure 6:
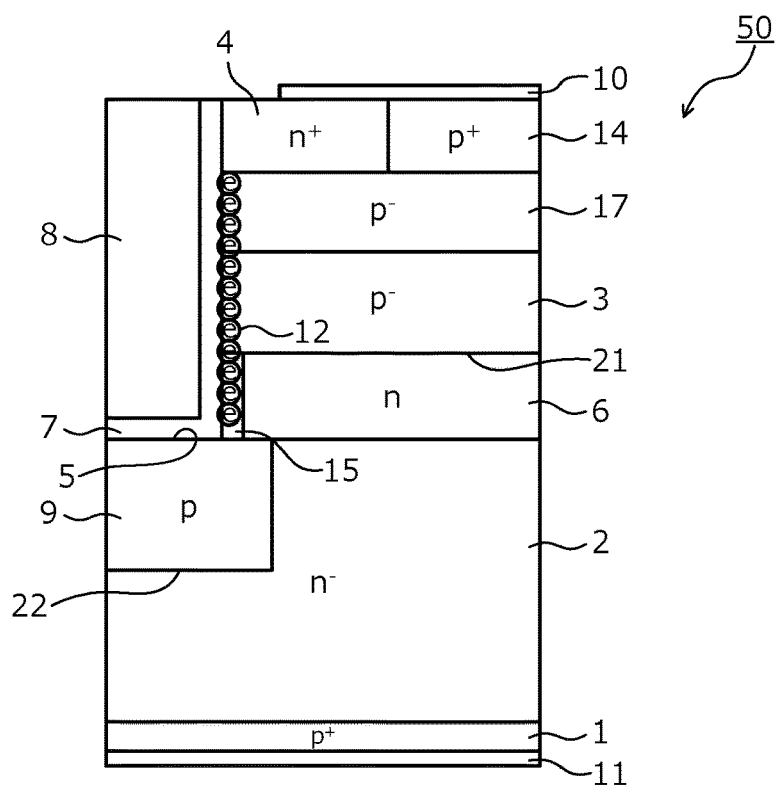
FIG. 6 is a cross-sectional view depicting operation of the semiconductor device according to the first embodiment, during an on-state.

FIG. 5 is a cross-sectional view depicting operation of the semiconductor device according to the first embodiment, during the off-state. FIG. 6 is a cross-sectional view depicting operation of the semiconductor device according to the first embodiment, during the on-state. The off-state is a state in which the semiconductor device is not operating, a state in which the gate voltage is at least set to 0V or less (gate voltage is not applied or negative gate voltage is applied to the gate electrode). The on-state is a state in which the semiconductor device is operating, a state in which the gate voltage is at least equal to the threshold voltage (gate voltage≥ the threshold voltage).

In the on-state, positive gate voltage is applied to the gate electrode 8, a channel electron inversion layer 12 is formed in a portion of the n⁻-type region 15 in contact with the gate insulating film 7, and channel electrons are induced. As a result, the p⁻-type base region 3 and the p-type embedded region 9 are not directly connected electrically, discharge of holes to the p⁻-type base region 3 is suppressed, and hole density in the n⁻-type drift layer 2 may be increased, whereby carrier density increases and on-resistance characteristics may be enhanced.

On the other hand, in the off-state, in the portion of the n⁻-type region 15 in contact with the gate insulating film 7, a hole inversion layer 13 is formed. The p⁻-type base region 3 and the p-type embedded region 9 are electrically connected by the hole inversion layer 13. Therefore, during the off-state, the p-type embedded region 9 is fixed at the emitter potential. In the n⁻-type region 15 having a low impurity concentration, induction of the hole inversion layer 13 is facilitated in the portion of the n⁻-type region 15 in contact with the gate insulating film 7, and even when the potential of the gate electrode 8 is close to 0V, the p-type embedded region 9 is at the emitter potential. The emitter potential is reached sooner than by the conventional structure during switching, whereby application of high electric field to the gate insulating film 7 is suppressed, the protective effect is increased, and decreases in breakdown voltage and reliability of the gate insulating film 7 may be suppressed.

Further, during the off-state, the hole inversion layer 13 occurs in the portion of the n⁻-type region 15 in contact with the gate insulating film 7 and therefore, the impurity concentration of the n⁻-type drift layer 2, the thickness of the gate insulating film 7, and a work function of the gate electrode 8 are suitably set. In particular, the impurity concentration of the n⁻-type region 15, for example, is the same as the impurity concentration of the n⁻-type drift layer 2 and is set to be low to an extent that the hole inversion layer 13 occurs (i.e., holes are present) in the off-state.

The p⁻-type base region 3 is provided above the high-concentration n-type layer 6. The p⁻-type base region 3 may be an epitaxial layer deposited on the high-concentration n-type layer 6 or may be a diffused region formed by ion implantation in a surface layer of the high-concentration n-type layer 6, for example.

While the threshold voltage decreases the lower the impurity concentration of the p⁻-type base region 3 is, preferably, the setting may be to an extent that when the gate voltage is at least set to 0V or less, no channel (n-type inversion layer) is formed in a portion of the p⁻-type base region 3 facing the gate electrode 8 (the device does not turn on). The n⁺-type emitter region 4 is selectively provided in the p⁻-type base region 3. The n⁺-type emitter region 4 may be an epitaxial layer or, for example, may be a diffused region formed by ion implantation. A p⁺-type contact region 14 may be selectively provided in the p⁻-type base region 3. The n⁺-type emitter region 4 is in contact with the gate insulating film 7, and the p⁺-type contact region 14 is provided at a position apart from the gate insulating film 7. The trench 5 penetrates through the n⁻-type emitter region 4, the p⁻-type base region 3, and the high-concentration n-type layer 6 and reaches the n⁻-type drift layer 2.

In the p⁻-type base region 3, to adjust the threshold voltage (Vth), ion implantation may be performed in the portion of the p⁻-type base region 3 where the channel is formed. As a result, a channel implanted layer 17 having an impurity concentration that is higher than that of the p⁻-type base region 3 is formed.

The gate electrode 8 faces the high-concentration n-type layer 6, the n⁻-type region 15, the p⁻-type base region 3, the n⁺-type emitter region 4, the channel implanted layer 17, and the n⁻-type drift layer 2 with the gate insulating film 7 that is provided on the bottom and sidewalls of the trench 5 intervening therebetween. An end of the gate electrode 8 facing a collector electrode 11 is positioned closer to the collector electrode 11 than is a pn junction 21 between the p⁻-type base region 3 and the high-concentration n-type layer 6. In the n⁻-type drift layer 2, a p-type diffused region (p-type embedded region (third semiconductor region of the second conductivity type)) 9 is selectively provided, separate from the p⁻-type base region 3. The p-type embedded region 9 is embedded in the n⁻-type drift layer 2 so as to surround the bottom of the trench 5, the p-type embedded region 9 facing the gate electrode 8 with the gate insulating film 7 intervening therebetween. In other words, the bottom of the trench 5 is positioned in the p-type embedded region 9. The p-type embedded region 9 has a width that is wider than a width of the trench 5 and a surface that faces the emitter and is in contact with the n⁻-type region 15 and the high-concentration n-type layer 6.

The p-type embedded region 9 may extend along an inner wall of the trench 5, in a direction toward an emitter electrode 10, to an extent that the p-type embedded region 9 does not face the gate electrode 8 across the gate insulating film 7 that is provided at the trench sidewall. The p-type embedded region 9 has a function of mitigating electric field applied to the n⁻-type drift layer 2. The p-type embedded region 9, for example, may be a diffused region formed by ion implantation. An impurity concentration of the p-type embedded region 9 may be variously set according to design conditions and may be set high to an extent that the energy level does degenerate (Fermi level does not move into the valance band). For example, the impurity concentration of the p-type embedded region 9 is set high enough whereby the p-type embedded region 9 is not entirely depleted even in an instance in which a high voltage is applied to the collector and, for example, is set to be about at least equal to the impurity concentration of the n⁻-type drift layer 2.

Further, the thickness of the gate insulating film 7 may be the same at portions thereof at the trench bottom and sidewalls. An emitter electrode (first electrode) 10 is in contact with the p⁻-type base region 3 and the n⁺-type emitter region 4 and is electrically insulated from the gate electrode 8 by a non-depicted interlayer insulating film. In an instance in which the p⁺-type contact region 14 is provided, the emitter electrode 10 is in contact with the p⁺-type contact region 14 and the n⁺-type emitter region 4. The collector electrode (second electrode) 11 is in contact with the p⁺-type collector layer 1.

While not particularly limited hereto, for example, in an instance in which the semiconductor device according to the first embodiment has a breakdown voltage of 13 kV, the n⁺-type emitter region 4 and the p⁺-type collector layer 1 have sufficiently high impurity concentrations (at least about $1\times10^{18}/cm^3$) and respective thicknesses thereof are at least about 0.1 μm. While dependent on the thickness of the gate insulating film 7, the impurity concentration of the p⁻-type base region 3 is in a range of about $1\times10^{15}/cm^3$ to $1\times10^{17}/cm^3$. The thickness of the n⁻-type drift layer 2 is in a range of about 100 μm to 150 μm. The impurity concentration of the n⁻-type drift layer 2 is in the range described above and preferably, may be about $5\times10^{14}/cm^3$ or less. A depth of the trench 5 is in a range of about 1 μm to 3 μm. The thickness of the gate insulating film 7 is in a range of about 50 nm to 200 nm. The impurity concentration of the p-type embedded region 9 is about $1\times10^{18}/cm^3$ or higher.

Next, operation of the semiconductor device according to the first embodiment is described. The emitter electrode 10 is in a state of being grounded or a state of having a negative voltage applied thereto (emitter potential≤0). The collector electrode 11 is in a state of having a positive voltage applied thereto (collector potential>0). In this state, the pn junction 21 between the p⁻-type base region 3 and the n⁻-type drift layer 2 is reverse biased. Therefore, a depletion layer (not depicted) spreads in the p⁻-type base region 3 and the n⁻-type drift layer 2, and a path (channel) for electrons, which are conduction carriers, is blocked. Here, in a state in which no gate voltage is applied to the gate electrode 8 or negative gate voltage is applied (gate voltage≤0V), no current flows between the emitter and collector. In other words, the off-state is maintained. While the off-state is maintained, the channel electron inversion layer 12 is formed in the portion of the n⁻-type region 15 in contact with the gate insulating film 7, and the p⁻-type base region 3 and the p-type embedded region 9 are electrically connected. Thus, the p-type embedded region 9 is fixed at about the same base (emitter) potential as the p⁻-type base region 3, and a pn junction 22 between the p-type embedded region 9 and the n⁻-type drift layer 2 is reverse biased.

On the other hand, in an instance in which the voltage applied to the gate electrode 8 is at least equal to the threshold voltage (gate voltage≥the threshold voltage), the channel electron inversion layer 12 is formed along the gate insulating film 7, in a portion (the portion facing the gate electrode 8) of the p⁻-type base region 3 that is between the n⁺-type emitter region 4 and the n⁻-type drift layer 2. As a result, the n⁺-type emitter region 4, the channel electron inversion layer 12, and the n⁻-type drift layer 2 form a path for electrons, which are conduction carriers. In other words, electrons from the emitter electrode 10 pass through the n⁺-type emitter region 4, an n-type inversion layer, and the n⁻-type drift layer 2 and move to the collector electrode 11, and current flows between the emitter and collector. This state is the on-state. During the on-state, the hole inversion layer 13 does not occur in the portion of the n⁻-type region 15 in contact with the gate insulating film 7 and therefore, the p-type embedded region 9 is in a floating state. Then, again, the voltage applied to the gate electrode 8 is at least set to 0V or less (gate voltage≤0V), whereby transition from the on-state to the off-state occurs. In this manner, the turning on/off of the semiconductor device is controlled by the voltage applied to the gate electrode 8.

Even when the gate voltage is greater than 0 but less than the threshold voltage (0< gate voltage< the threshold voltage), similarly to an instance in which the gate voltage is 0V or less, the channel electron inversion layer 12 is not formed. Nonetheless, in actual practice, after a command value (gate voltage< the threshold voltage) for external control to turn off the semiconductor device is applied to the gate electrode 8, until the gate voltage becomes 0V, the semiconductor device according to the first embodiment is in a transitional state of transitioning from operation to suspension of operation and does not completely stop. Therefore, in the description above, while a state in which the gate voltage is 0V or less at which operation of the semiconductor device according to the first embodiment is completely stopped is assumed as the off-state, provided the gate voltage when the hole inversion layer 13 is formed in the n⁻-type region 15 and the gate voltage (i.e., the threshold voltage) when the channel electron inversion layer 12 is formed in the p⁻-type base region 3 (on-state) are adjusted to be equal, an instance in which the gate voltage is less than the threshold voltage (gate voltage< the threshold voltage) may be assumed as the off-state.

Figure 7:
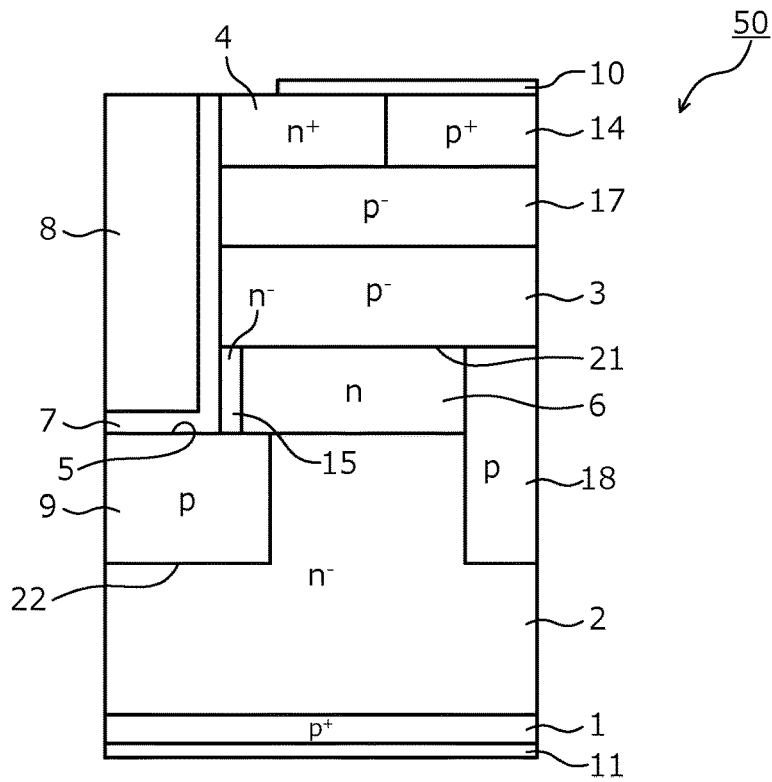
FIG. 7 is a cross-sectional view depicting another example of the structure of the semiconductor device according to the first embodiment.

FIG. 7 is a cross-sectional view depicting another example of the structure of the semiconductor device according to the first embodiment. As depicted in FIG. 7, in the semiconductor device according to the first embodiment, between the trench 5 and an adjacent trench, an inter-trench p-type embedded region 18 may be provided in a surface layer of the high-concentration n-type layer 6. The inter-trench p-type embedded region 18 is provided at the same depth as that of the p-type embedded region 9 and has a same potential as that of the p$^-$-type base region 3. The inter-trench p-type embedded region 18, similarly to the p-type embedded region 9, has a function of mitigating electric field applied to the n$^-$-type drift layer 2.

Further, in the description above, while a device that uses a conductivity modulation effect such as that of an IGBT is described as an example, the present invention may be applied to a metal oxide semiconductor field effect transistor (MOSFET). In this instance, instead of the p$^+$-type collector layer 1, an n$^+$-type drain layer is provided, while the n$^+$-type emitter region 4, the emitter electrode 10, and the collector electrode 11 are an n$^+$-type source region, a source electrode, and a drain electrode, respectively. Further, a silicon (Si) semiconductor may be used as a semiconductor material of the semiconductor device according to the first embodiment or, for example, a semiconductor having a band gap that is wider than that of silicon such as a silicon carbide semiconductor (hereinafter, wide band gap semiconductor) may be used.

In an instance of a MOSFET, to set the p-type embedded region 9 and the p$^-$-type base region 3 at the same potential, a portion of the p-type embedded region 9 is extended, whereby the p-type embedded region 9 and the inter-trench p-type embedded region 18 are connected to each other. In the semiconductor device according to the first embodiment, the p-type embedded region 9 and the p$^-$-type base region 3 may be set to the same potential by the n$^-$-type region 15 and therefore, the p-type embedded region 9 and the inter-trench p-type embedded region 18 need not be connected to each other and the inter-trench p-type embedded region 18 may be omitted.

Next, a method of manufacturing the semiconductor device according to the first embodiment is described. First, in an n$^-$-type semiconductor substrate constituting the n$^-$-type drift layer 2, at a front surface thereof, the p-type embedded region 9 is formed by ion implantation. Next, on the front surface of the n$^-$-type drift layer 2, an n$^-$-type layer is epitaxially grown. Next, the high-concentration n-type layer 6 is formed in the n$^-$-type layer by ion implantation. Here, regions that are not ion-implanted are created using an ion implantation shielding mask, and the n$^-$-type region 15 is formed. Further, the high-concentration n-type layer 6 may be formed by epitaxial growth. In this instance, the n$^-$-type region 15 is formed by counter-doping a p-type impurity in a portion of the high-concentration n-type layer 6. In an instance in which the inter-trench p-type embedded region 18 is provided, the inter-trench p-type embedded region 18 is formed by ion implantation in the surface layer of the high-concentration n-type layer 6.

Next, the p$^-$-type base region 3 is epitaxially grown on the high-concentration n-type layer 6. Next, the trench 5, the gate insulating film 7, and the gate electrode 8 are sequentially formed, thereby forming the MOS gate. Next, to adjust the threshold voltage (Vth), the channel implanted layer 17 may be formed by performing ion implantation in a portion of the p$^-$-type base region 3 where the channel is formed. Next, the n$^+$-type emitter region 4 is selectively formed in the p$^-$-type base region 3 by ion implantation of an n-type impurity. Next, the p$^+$-type contact region 14 may be selectively formed in the p$^-$-type base region 3 by ion implantation of a p-type impurity.

Next, for example, the interlayer insulating film constituted by a BPSG film or the like is deposited so as to cover the gate electrode 8. Next, interlayer insulating film is patterned and a contact hole is formed therein, whereby the n$^-$-type emitter region 4 and the p$^+$-type contact region 14 are exposed. Next, in the contact hole, for example, by a sputtering method, the emitter electrode 10 is formed so as to be in contact with the n$^+$-type emitter region 4 and the p$^+$-type contact region 14.

Next, the n$^-$-type drift layer 2 is ground from a back surface thereof, to a position that corresponds to a product thickness for use as a semiconductor device. Next, in an entire area of the back surface of the n$^-$-type drift layer 2, for example, a p-type impurity is ion-implanted, thereby forming the p$^+$-type collector layer 1 in an entire are of the back surface of the n$^-$-type drift layer 2. The p$^+$-type collector layer 1 may be a p$^+$-type starting substrate. In this instance, the n$^-$-type drift layer 2 is formed by being deposited by epitaxial growth on, for example, a front surface of the p$^+$-type starting substrate constituting the p$^+$-type collector layer 1. Next, the collector electrode 11 that is in contact with the p$^+$-type collector layer 1 is formed in an entire area of the back surface of the semiconductor substrate. Thereafter, the semiconductor wafer is cut (diced) into individual chips, whereby the trench-type IGBT 50 depicted in FIG. 1 is completed.

As described above, according to the first embodiment, during the on-state, the p-type embedded region is in a floating state and therefore, minority carriers (holes) are not pulled out from the p-type embedded region to the emitter electrode. Therefore, in a device that uses a conductivity modulation effect such as that of an IGBT, etc., conductivity modulation is not obstructed. As a result, degradation of the on-resistance characteristics may be prevented. In other words, for example, the on-resistance characteristics may be enhanced compared to an instance in which the p-type embedded region is fixed to the emitter potential during the on-state like in Japanese Laid-Open Patent Publication No. 2007-242852.

Further, for example, in an instance in which the p-type embedded region is in a floating state during the off-state like in Japanese Laid-Open Patent Publication No. 2007-242852, depending on the state of the potential of the p-type embedded region, the potential difference between the gate electrode and the p-type embedded region increase and high electric field may concentrate at the bottom of the gate insulating film. On the other hand, according to the first embodiment, during the off-state, the p-type embedded region is electrically connected to the p$^-$-type base region by the hole inversion layer and is fixed to the emitter potential (for example, ground). As a result, even when high voltage is applied to the collector electrode, the potential difference (voltage applied to the bottom of the gate insulating film) of the gate electrode and the p-type embedded region becomes about the gate voltage and therefore, high electric field does not concentrate at the bottom of the gate insulating film. Further, the p-type embedded region is fixed to the emitter potential, whereby a potential of a portion of the n$^-$-type drift layer, along the gate insulating film is kept close to the emitter potential and the voltage applied to the gate insulating film is about equal to the gate voltage. Therefore, high electric field does not concentrate in the gate insulating film. Thus, breakdown voltage characteristics may be enhanced to a greater extent than conventionally and occurrences of malfunction and/or dielectric breakdown may be prevented. Further, high electric field does not concentrate in the gate insulating film and therefore, an allowed upper limit of the collector voltage may be increased to an extent that electric field close to the critical electric field strength of the semiconductor material occurs. As a result, for example, a wide band gap semiconductor is used and high breakdown voltage becomes possible to a state close to a theoretical limit of the wide band gap semiconductor material.

Further, according to the first embodiment, a hole inversion layer is formed in the surface region of the n⁻-type region during the off-state, and the p⁻-type base region and the p-type embedded region are electrically connected to each other by the hole inversion layer, whereby, for example, formation of a diffused region for connecting the p⁻-type base region and the p-type embedded region like in Japanese Laid-Open Patent Publication No. 2007-242852 described above is unnecessary. Therefore, manufacturing processes are simpler than conventionally.

Figure 8:
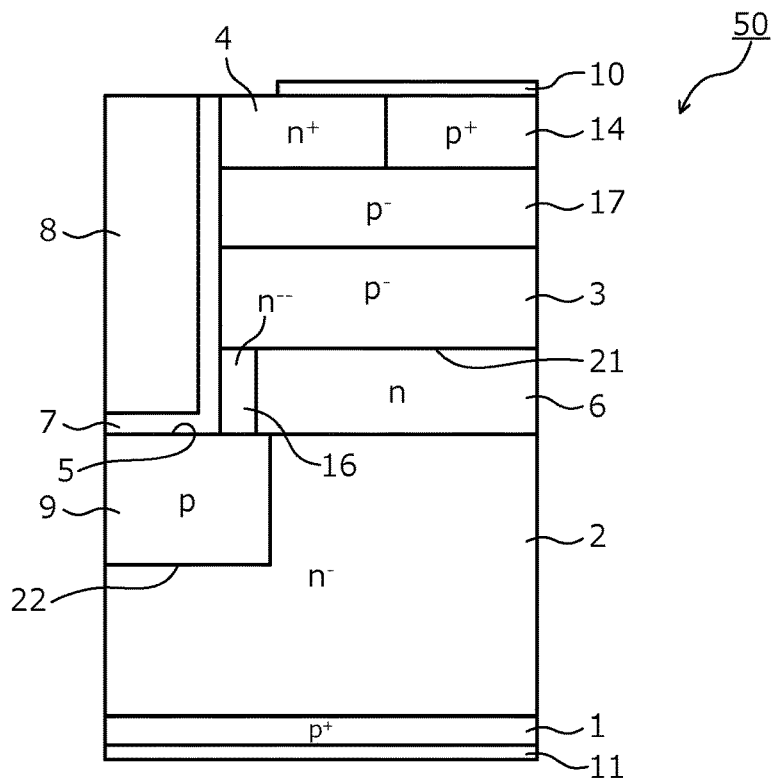
FIG. 8 is a cross-sectional view of a structure of a semiconductor device according to a second embodiment.
Figure 9:
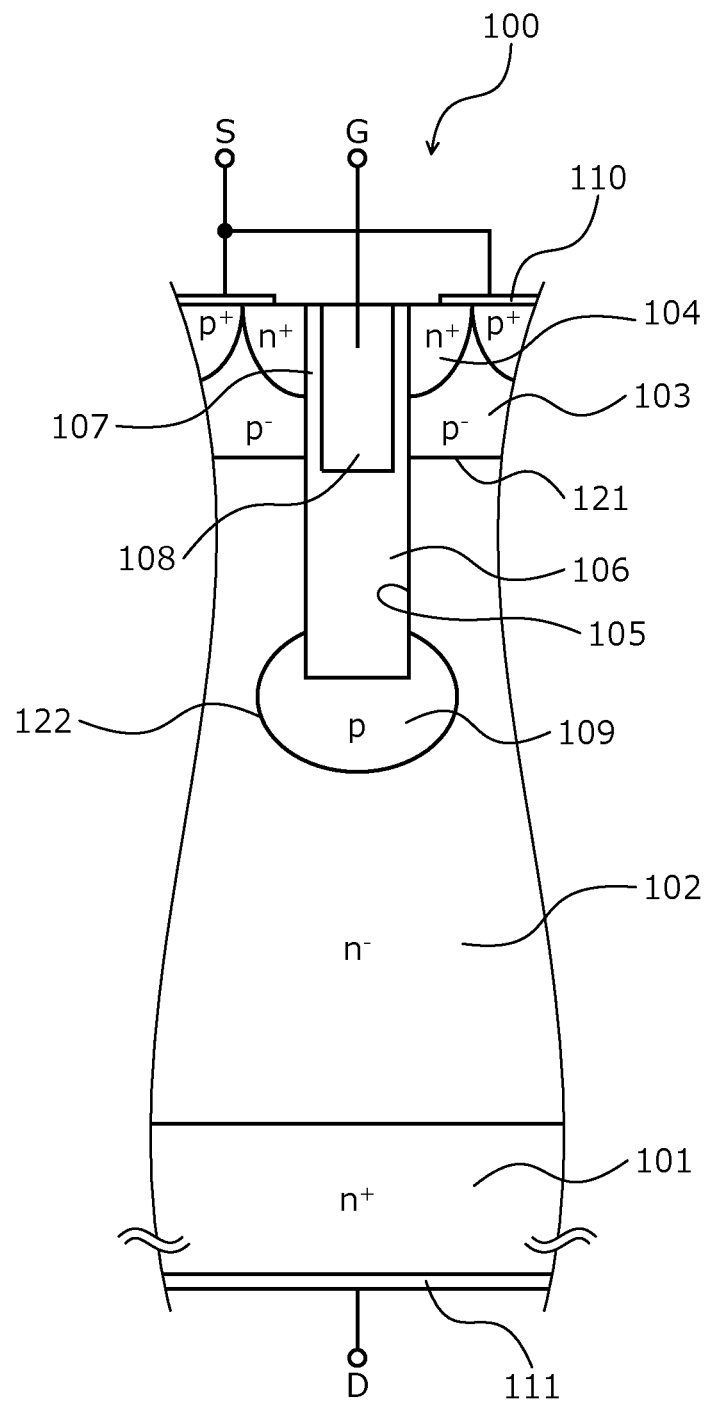
FIG. 9 is a cross-sectional view of a structure of components of a conventional semiconductor device.
Figure 10:
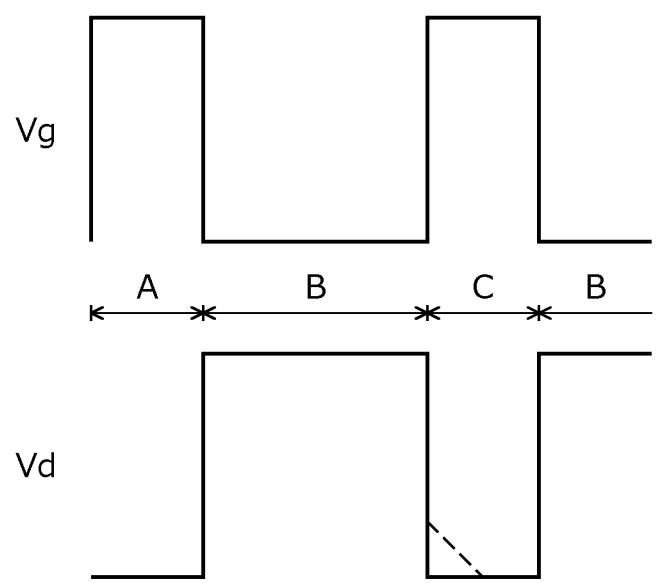
FIG. 10 is a characteristics diagram depicting voltage waveforms of the conventional semiconductor device.
Figure 11:
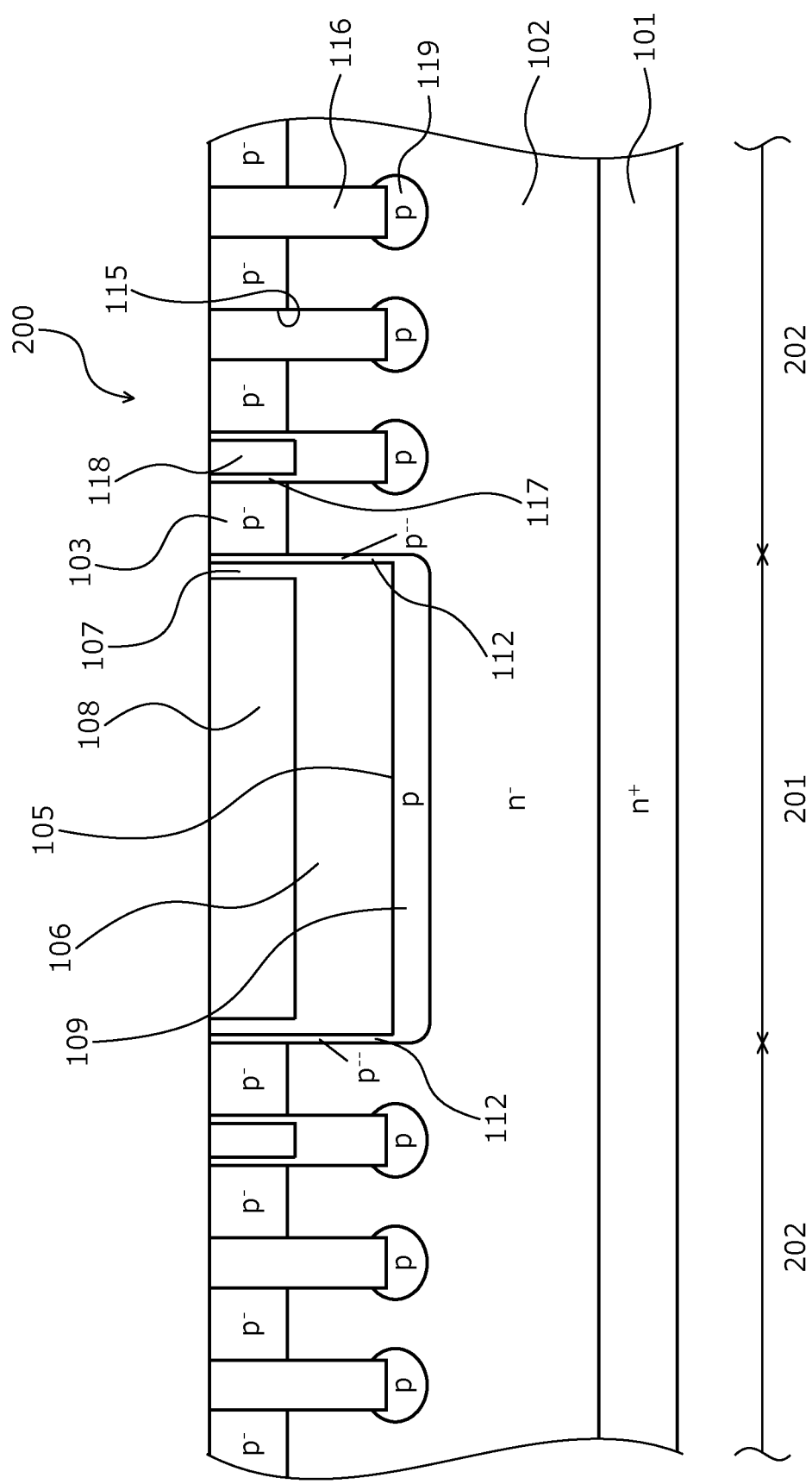
FIG. 11 is a cross-sectional view depicting another example of a conventional semiconductor device.

FIG. 8 is a cross-sectional view of a structure of a semiconductor device according to a second embodiment. A silicon carbide semiconductor device according to the second embodiment includes an n⁻⁻⁻-type region 16 having an extremely low concentration, instead of the n⁻-type region 15. The n⁻⁻⁻-type region 16 is provided in the same location as that of the n⁻-type region 15 in the first embodiment and is a region having an impurity concentration that is lower than the impurity concentration of the n⁻-type drift layer 2.

Similarly to the first embodiment, during the off-state, the channel electron inversion layer 12 is formed in a portion of the n⁻⁻⁻-type region 16 in contact with the gate insulating film 7, whereby the p⁻-type base region 3 and the p-type embedded region 9 are electrically connected. The impurity concentration of the n⁻⁻⁻-type region 16 is set to be low, whereby a threshold value for forming the hole inversion layer 13 may be reduced. In the second embodiment, the impurity concentration is lower than that of the n⁻-type region 15 and thus, induction of the hole inversion layer 13 is facilitated and the impurity concentration of the n⁻⁻⁻-type region 16 is adjusted, whereby the p-type embedded region 9 may be set to the emitter potential even when the potential of the gate electrode 8 is close to 0V. Therefore, in the second embodiment, the emitter potential is reached sooner during switching that in the first embodiment, whereby application of high electric field to the gate insulating film 7 is suppressed, the protective effect is increased, and the occurrence of decreases in the breakdown voltage and the reliability of the gate insulating film 7 may be further suppressed.

The semiconductor device according to the second embodiment may be formed similarly to the semiconductor device according to the first embodiment. Further, the n⁻⁻⁻-type region 16 may be formed by counter-doping a p-type impurity in a portion of the high-concentration n-type layer 6.

As described above, according to the second embodiment, during the on-state, the p-type embedded region is in a floating state and therefore, minority carriers (holes) are not pulled out from the p-type embedded region to the emitter electrode. Further, during the off-state, a hole inversion layer is formed in the surface layer of the n⁻⁻⁻-type region, whereby the p⁻-type base region and the p-type embedded region may be electrically connected by the hole inversion layer. The n⁻⁻⁻-type region is set to have an impurity concentration that is lower than the impurity concentration of the n⁻-type region of the first embodiment and thus, induction of the hole inversion layer is facilitated and the emitter potential is reached sooner during switching than in the first embodiment, whereby application of high electric field to the gate insulating film is suppressed, the protective effect is increased, and the occurrence of decreases in the breakdown voltage and the reliability of the gate insulating film may be suppressed.

In the foregoing, the present invention may be variously modified within a range not departing from the spirit of the invention and in the embodiments described above, for example, dimensions, impurity concentrations, etc. of parts may be variously set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, during the on-state, the p-type embedded region (third semiconductor region of the second conductivity type) is in a floating state and therefore, minority carriers (holes) are not pulled out from the p-type embedded region to the emitter electrode (first electrode). Thus, in a device that uses the conductivity modulation effect of an IGBT, etc., the conductivity modulation is not obstructed. As a result, degradation of the on-resistance characteristics may be prevented.

The semiconductor device according to the present invention achieves an effect in that on-resistance characteristics may be enhanced.

As described above, the semiconductor device according to the invention is useful for power semiconductor devices used in power converting equipment such as inverters, power source devices such as those in various types of industrial machines, automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a first semiconductor layer of a first conductivity type, having a first main surface and a second main surface that are opposite to each other;
    a second semiconductor layer of the first conductivity type, provided at the first main surface of the first semiconductor layer, the second semiconductor layer having an impurity concentration that is higher than an impurity concentration of the first semiconductor layer, the second semiconductor layer having a first surface and a second surface that are opposite to each other, the second surface thereof facing the first semiconductor layer;
    a first semiconductor region of a second conductivity type, provided at the first surface of the second semiconductor layer;
    a second semiconductor region of the first conductivity type, selectively provided in the first semiconductor region;
    a trench that penetrates through the second semiconductor region and the first semiconductor region and reaches the first semiconductor layer;
    a gate insulating film provided in the trench, along a bottom and sidewalls of the trench;
    a gate electrode provided on the gate insulating film in the trench;
    a third semiconductor region of the second conductivity type, selectively provided in the first semiconductor layer to surround the bottom of the trench;

a fourth semiconductor region provided at the second main surface of the first semiconductor layer;

a fifth semiconductor region of the first conductivity type, selectively provided in the second semiconductor layer, the fifth semiconductor region having an impurity concentration that is lower than the impurity concentration of the second semiconductor layer;

a first electrode that is electrically connected to the first semiconductor region and the second semiconductor region; and a second electrode that is electrically connected to the fourth semiconductor region, wherein the fifth semiconductor region has
- a first surface and a second surface that are opposite to each other, the first surface being in contact with the first semiconductor region, the second surface being in contact with the third semiconductor region, and
- a side surface that is in contact with the gate insulating film.

2. The semiconductor device according to claim 1, wherein
the impurity concentration of the fifth semiconductor region is equal to the impurity concentration of the first semiconductor layer.

3. The semiconductor device according to claim 1, wherein
the impurity concentration of the fifth semiconductor region is lower than the impurity concentration of the first semiconductor layer.

4. The semiconductor device according to claim 1, wherein
the fifth semiconductor region has a width that is narrower than a width of the second semiconductor layer.

5. The semiconductor device according to claim 1, wherein
the trench has a shape of a stripe, and
the fifth semiconductor region includes a plurality of fifth semiconductor region segments that are selectively provided in portions of the second semiconductor layer, along a longitudinal direction of the trench.

* * * * *